(12) United States Patent
Watanabe

(10) Patent No.: US 6,921,959 B2
(45) Date of Patent: Jul. 26, 2005

(54) SEMICONDUCTOR DEVICE

(75) Inventor: Kentaro Watanabe, Kawasaki (JP)

(73) Assignee: Kabushiki Kaisha Toshiba (JP)

( * ) Notice: Subject to any disclaimer, the term of this patent is extended or adjusted under 35 U.S.C. 154(b) by 49 days.

(21) Appl. No.: 10/723,477

(22) Filed: Nov. 25, 2003

(65) Prior Publication Data

US 2005/0051869 A1 Mar. 10, 2005

(30) Foreign Application Priority Data

Sep. 10, 2003 (JP) .......................................... 2003-318389

(51) Int. Cl.[7] .............................................. H01L 29/00
(52) U.S. Cl. ...................... 257/531; 257/127; 257/379; 257/409; 257/528; 257/904
(58) Field of Search ................................ 257/531, 127, 257/379, 409, 528, 904

(56) References Cited

U.S. PATENT DOCUMENTS

| | | | |
|---|---|---|---|
| 5,936,299 A | | 8/1999 | Burghartz et al. |
| 6,310,387 B1 | * | 10/2001 | Seefeldt et al. ............. 257/531 |
| 6,600,181 B2 | * | 7/2003 | Otake et al. ................. 257/277 |
| 6,747,294 B1 | * | 6/2004 | Gupta et al. ................. 257/127 |
| 2002/0045295 A1 | * | 4/2002 | Hiraga ........................ 438/140 |
| 2003/0232483 A1 | * | 12/2003 | Fujiishi ....................... 438/396 |
| 2004/0094822 A1 | * | 5/2004 | Yu .............................. 257/531 |

FOREIGN PATENT DOCUMENTS

JP            07201855 A    *   8/1995    ....... H01L/21/3205

* cited by examiner

Primary Examiner—Amir Zaparian
Assistant Examiner—Ida M. Soward
(74) Attorney, Agent, or Firm—DLA Piper Rudnick Gray Cary US, LLP

(57) ABSTRACT

A semiconductor device includes a semiconductor substrate, an insulating layer, an inductor, a guard ring and a potential-applying line. The insulating layer is formed on the semiconductor substrate. The inductor is formed on the insulating layer. The guard ring is formed in the semiconductor substrate, surrounding the inductor and being a closed ring composed of waving segments connected, end to end. The potential-applying line applies a predetermined potential to the guard ring.

13 Claims, 5 Drawing Sheets

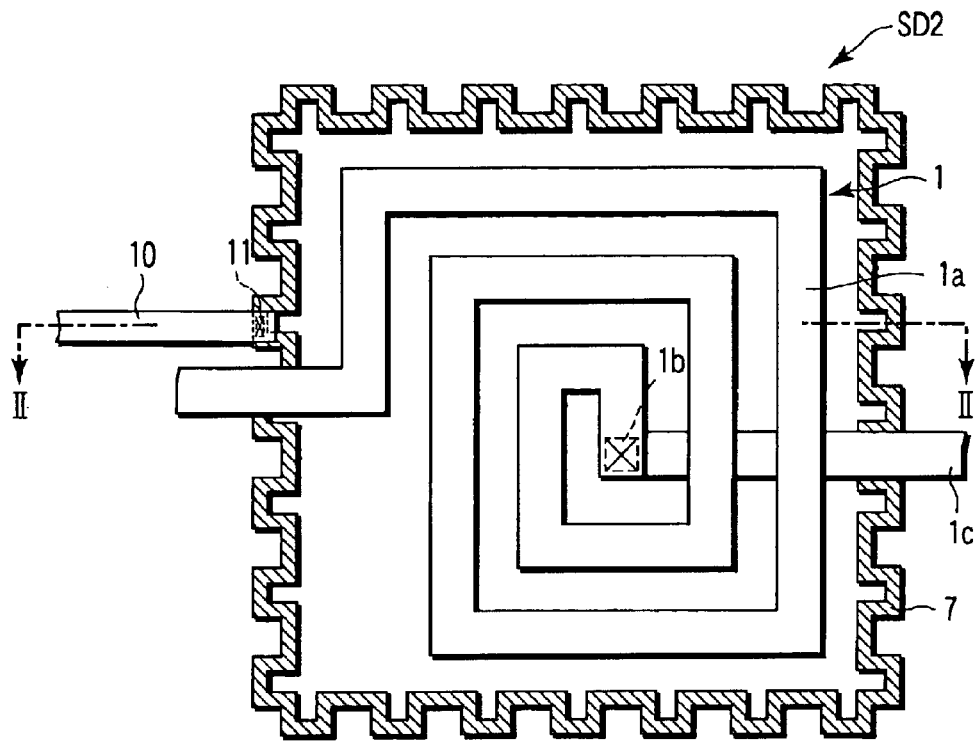
F I G. 3
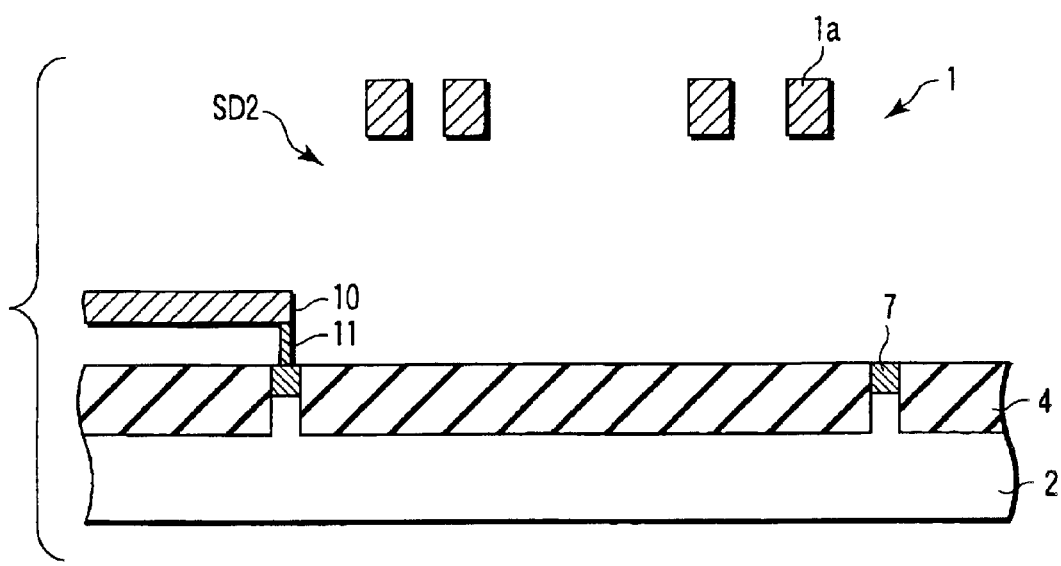
F I G. 4

SEMICONDUCTOR DEVICE

CROSS-REFERENCE TO RELATED APPLICATIONS

This application is based upon and claims the benefit of priority from the prior Japanese Patent Application No. 2003-318389, filed Sep. 10, 2003, the entire contents of which are incorporated herein by reference.

BACKGROUND OF THE INVENTION

1. Field of the Invention

The present invention relates to a semiconductor device. More particularly, the invention relates to a technique that is useful when applied to inductors that are incorporated in semiconductor devices.

2. Description of the Related Art

Semiconductor integrated circuits designed for RF (Radio Frequency) use may comprise an inductor in some cases. The inductor is a multi-layer component comprising layers deposited one upon another on, for example, a semiconductor substrate.

Other circuit elements, such as MOS (Metal Oxide Semiconductor) transistors, are formed on the semiconductor substrate. The noise that the other elements generate may influence the characteristics of the inductor. To protect the other circuit elements against the influence of the noise, a guard ring is formed, surrounding the inductor.

FIG. 10 is a plan view showing a conventional semiconductor device that comprises an inductor and a guard ring. FIG. 11 is a sectional view of this semiconductor device, taken along line V—V shown in FIG. 10.

The semiconductor device comprises an inductor 1, a semiconductor substrate 2, and a guard ring 3. The inductor 1 is provided above the semiconductor substrate 2 and comprises a first metal part 1a, a via plug 1b and a second metal part 1c. The first metal part 1a is shaped like, for example, a spiral. The guard ring 3 surrounds the first metal part 1a. The guard ring 3 is a diffusion layer formed by injecting p- or n-type impurities into the substrate 2. An element-isolating region 4 is formed in the surface of the semiconductor substrate 2 and surrounds the guard ring 3.

A potential-applying line 5 is provided above the guard ring 3. The line 5 is almost identical in shape to the guard ring 3. A plurality of contact plugs 6 connect the guard ring 3 and the potential-applying line 5. The line 5 is fixed at, for example, the ground potential. Thus, the guard ring 3 is fixed at the ground potential and set at the same potential as the potential-applying line 5. Note that an insulating layer, for example, is formed between the semiconductor substrate 2 and the inductor 1.

In the semiconductor device thus configured, the inductor 1 is protected from the noise generated by the MOS transistors and the like formed on the semi-conductor substrate 2. Hence, the noise would not influence the characteristics of the inductor 1.

In this regard, techniques of reducing the noise of inductors are known (see the specification of U.S. Pat. No. 5,936,299).

A current may flow clockwise in the inductor 1. In this case, a magnetic flux develops in the inductor 1, which extends backward from the plane of FIG. 10. Further, a magnetic flux develops outside the inductor 1, which extends in the opposite direction, that is, forwardly from the plane of FIG. 10. The flux outside the inductor 1 changes as the current flowing in the inductor 1 varies with time.

The electromotive force V in the semiconductor device is given as follows:

$$V = d\phi/dt$$

where $\phi$ is the intensity of the magnetic flux extending in the guard ring 3 and the potential-applying line 5, both provided outside the inductor 1. Thus, the electromotive force is generated in the guard ring 3 and also in the potential-applying line 5. The electromotive force induces a current. The current flows in the guard ring 3 and potential-applying line 5 in the direction opposite to the current that flows in the inductor 1. The inductance of the inductor 1 inevitably decreases. Further, the current flowing in the guard ring 3 and the potential-applying line 5 increases the power consumption. This lowers Q (Quality Factor) of the inductor 1.

BRIEF SUMMARY OF THE INVENTION

A semiconductor device according to a first aspect of this invention comprises: a semiconductor substrate; an insulating layer formed on the semiconductor substrate; an inductor formed on the insulating layer; a guard ring formed in the semiconductor substrate, surrounding the inductor and being a closed ring composed of waving segments connected, end to end; and a potential-applying line which applies a predetermined potential to the guard ring.

A semiconductor device according to a second aspect of the invention comprises: a semiconductor substrate; an insulating layer formed on the semiconductor substrate; an inductor formed on the insulating layer; a guard ring formed in the semiconductor substrate, surrounding the inductor and being composed of a plurality of segments spaced apart from one another; and a potential-applying line which applies a predetermined potential to the guard ring and which comprises a plurality of segments located above spaces between the segments of the guard ring, respectively.

BRIEF DESCRIPTION OF THE SEVERAL VIEWS OF THE DRAWING

FIG. 3 is a plan view depicting the major components of a semiconductor device SD2 according to a second embodiment of the invention;

FIG. 4 is a sectional view of the semiconductor device SD2, taken along line II—II shown in FIG. 3;

DETAILED DESCRIPTION OF THE INVENTION

Embodiments of the present invention will be described, with reference to the accompanying drawings.

First Embodiment

Figure 1:
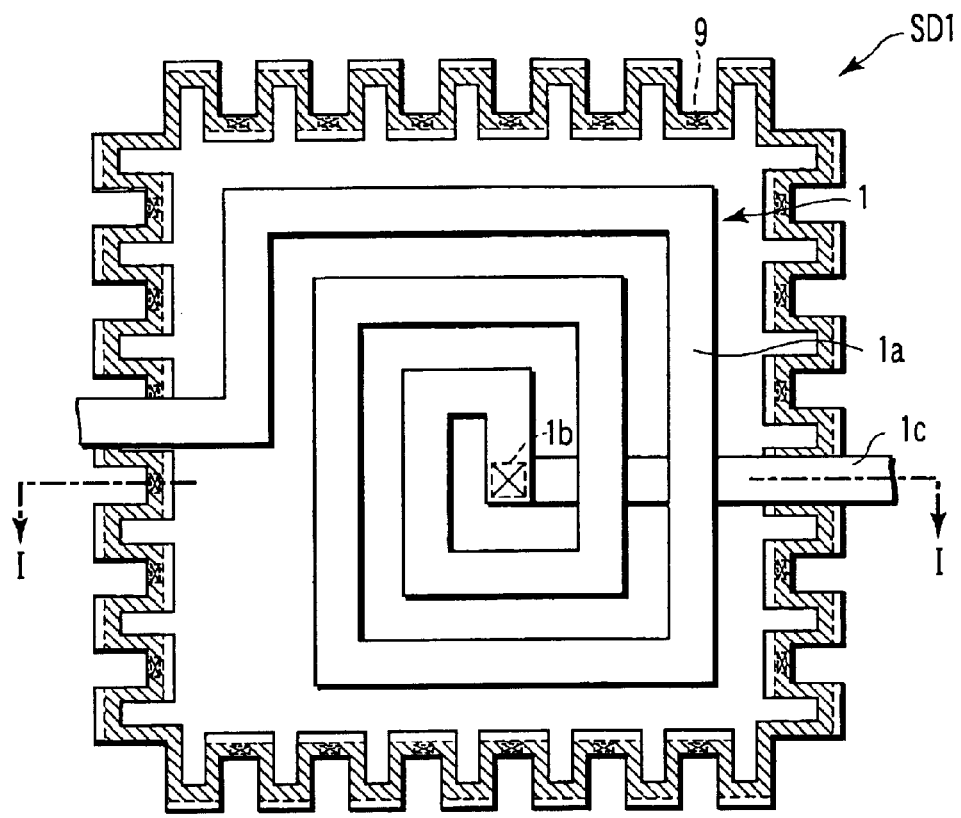
FIG. 1 is a plan view showing the major components of a semiconductor device SD1 according to a first embodiment of the present invention.
Figure 2:
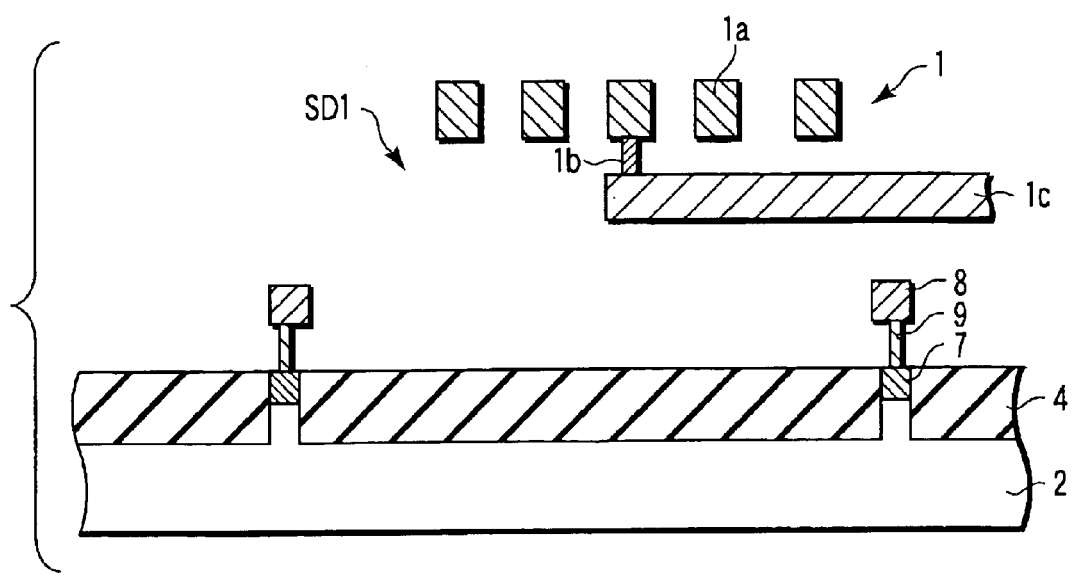
FIG. 2 is a sectional view of the semiconductor device SD1, taken along line I—I shown in FIG. 1.

FIG. 1 is a plan view illustrating the major components of a semiconductor device SD1 according to the first embodiment of this invention. FIG. 2 is a sectional view of the semiconductor device SD1, taken along line I—I shown in FIG. 1.

As FIG. 2 shows, an inductor 1 is provided above a semiconductor substrate 2. The semiconductor substrate 2 is, for example, a p-type one. The inductor 1 comprises a first metal part 1a, a via plug 1b and a second meal part 1c. The first metal part 1a is shaped like, for example, a spiral. The inductor 1 is a multi-layer component, comprising layers deposited one upon another on the semiconductor substrate 2. The inductor 1 may be of any shape. It may be square, circular, octagonal, or the like.

A guard ring 7 is formed on the semiconductor substrate 2. The guard ring 7 surrounds the first metal part 1a of the inductor 1, which is spiral. As FIG. 1 shows, the guard ring 7 is waving. In other words, the ring 7 is composed of not only segments that extend parallel to the tangential direction of the inductor 1, but also segments that extend perpendicular to the tangential direction. The segments of the ring 7, which extend parallel to the tangential direction, and the segments of the ring 7, which extend perpendicular to the tangential direction, are alternately arranged and connected together.

The guard ring 7 is a $p^+$ diffusion layer that has been formed by injecting p-type impurities into the p-type semiconductor substrate 2. The guard ring 7 is surrounded by an insulator (not shown) such as an oxide film. The guard ring 7 may be made of self-aligned silicide.

An element-isolating region 4 is provided in the surface of the semiconductor substrate 2 and surrounds the guard ring 7. The element-isolating region 4 has been formed by means of STI (Shallow Trench Isolation). STI is performed, by making a trench in the surface of the semiconductor substrate 2 and then filling the trench with insulating material.

A potential-applying line 8 is provided above the guard ring 7. The line 8 is waving in the same way as the guard ring 7. The line 8 is used to apply a predetermined potential to the guard ring 7. In the present embodiment, the potential-applying line 8 has the same shape as the guard ring 7. Nonetheless, the line 8 may differ in shape from the guard ring 7, provided that it is positioned so that a plurality of contact plugs 9 (later described) may be connected to the guard ring 7. The potential-applying line 8 is made of, for example, metal having low specific resistance.

The contact plugs 9 connect the guard ring 7 and the potential-applying line 8. The potential-applying line 8 is fixed at, for example, the ground potential. Thus, the guard ring 7 is fixed at the ground potential and set at the same potential as the line 8. The ground potential is applied from the line 8 through the contact plugs 9. Note that an insulating layer, for example, is formed between the semiconductor substrate 2 and the inductor 1.

Figure 10:
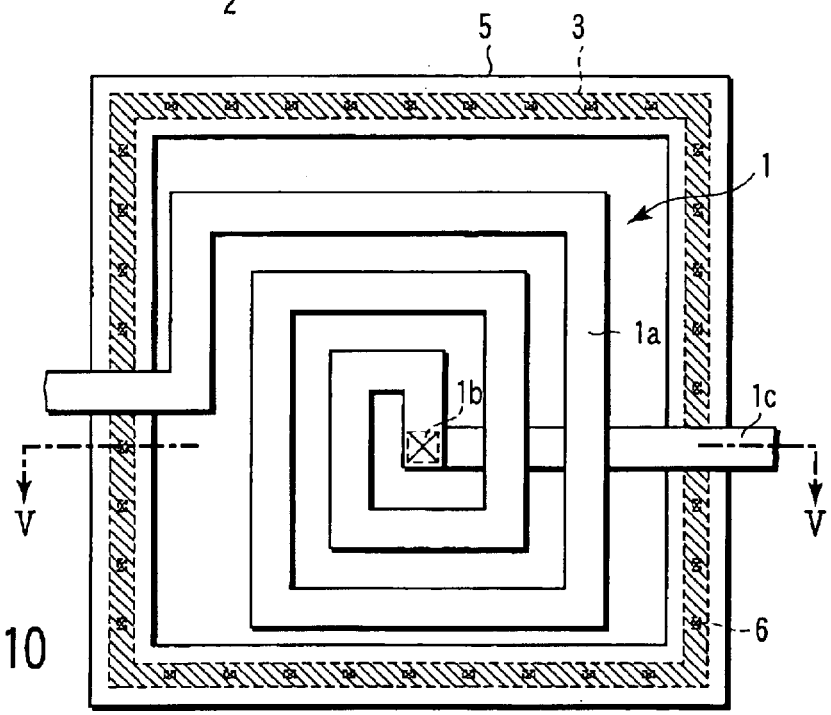
FIG. 10 is a plan view depicting a conventional semiconductor device that comprises a guard ring.
Figure 11:
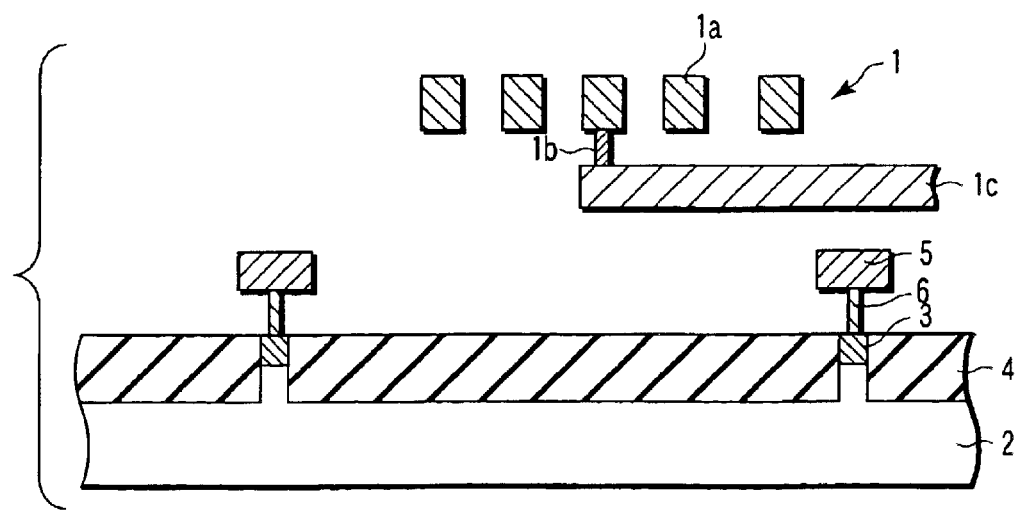
FIG. 11 is a plan view showing the conventional semiconductor device, taken along line V—V shown in FIG. 10.

In the semiconductor device SD1 thus configured, the guard ring 7 may have a resistance higher than that of the guard ring 3 that is shown in FIG. 10. The electromotive force V developed in the guard ring 7 can be calculated as follows:

$$V = d\phi/dt$$

where $\phi$ is the magnetic flux generated in the guard ring 7 by the inductor 1. Note that the magnetic flux $\phi$ changes with time. The current Ig flowing in the guard ring 7 is given by Ohm's law. Namely:

$$Ig = V/Rg$$

where Rg is the resistance of the guard ring 7.

As indicated above, the guard ring 7 is waving. The resistance Rg is therefore higher than otherwise. Thus, the current Ig is smaller than otherwise.

The current Ig flows in the direction opposite to the direction in which a current flows in the inductor 1. The current Ig may therefore lower the inductance L of the inductor 1. Nonetheless, a decrease in the inductance L of the inductor 1 can be inhibited, because the guard ring 7, which is waving, decreases the current Ig more than a non-waving guard ring.

The power Pg that the guard ring 7 consumes is:

$$Pg = V^2/Rg.$$

The power Pg can therefore be reduced by increasing the resistance Rg. Hence, reduction of the power Pg can inhibit the decrease in the quality factor (Q) of the inductor 1.

In this embodiment, the potential-applying line 8 is waving, too. So shaped, the line 8 can achieve the same advantage as the guard ring 7.

As described in detail, the inductor 1 is provided above the semiconductor substrate 2. The guard ring 7, which is waving, is formed in the surface of the substrate 2 and surrounds the inductor 1. The potential-applying line 8, which is waving like the ring 7, is provided above the guard ring 7. The potential-applying line 8 supplies the predetermined potential to the guard ring 7.

Hence, the resistance Rg of the guard ring 7 is higher than in the case where the ring 7 is not waving. The current Ig flowing in the guard ring 7 is therefore small, which inhibits the decrease in the inductance L of the inductor 1.

The increase in the resistance Rg of the guard ring 7 can decrease the power Pg that the guard ring 7 consumes. This makes it possible to inhibit the decrease in Q of the inductor 1.

The potential-applying line 8, which is waving like the ring 7, can achieve the same advantage as the guard ring 7.

The potential-applying line 8 is formed in alignment with the guard ring 7 and applies the ground potential to the guard ring 7 through the contact plugs 9. The guard ring 7 is therefore set uniformly at the ground potential, in its entirety.

As indicated above, the guard ring 7 is composed of a group of straight segments that extend parallel to the tangential direction of the inductor 1 and another group of straight segments that extend perpendicular to the tangential direction, each connected to, and extending at right angles to, either adjacent segment of the first-mentioned group. Nonetheless, the segments of the second-mentioned group need not extending at right angles to either adjacent segment of the first-mentioned group. Further, it suffices if at least some of the segments vector component perpendicular to the tangential direction of the inductor 1. In this case, too, the guard ring 7 can attain the same advantage. Alternatively the segments may be curved and thus forming, for example, a sinusoidal wave.

In the embodiment, both the guard ring 7 and the potential-applying line 8 are waving. Instead, only one of them may be waving.

The semiconductor substrate 2 may be an n-type one, not a p-type one as described above. If the substrate 2 is of n-type, the guard ring 7 will be an n+ diffusion layer that is formed by injecting n-type impurities into the n-type semiconductor substrate. In this case, the guard ring 7 is set at a power-supply potential that is even higher than the potential of the potential-applying line 8.

Second Embodiment

In the second embodiment of the invention, no potential-applying lines are used to apply a potential from the power-supply terminal to the guard ring 7.

FIG. 3 is a plan view depicting the major components of a semiconductor device SD2 that is the second embodiment of the invention. FIG. 4 is a sectional view of the semiconductor device SD2, taken along line II—II shown in FIG. 3. The components similar or identical to those of the first embodiment are designated at the same reference numerals and will not be described in detail.

As FIG. 4 shows, a power-supply line 10 is provided above a part of the guard ring 7. The power-supply line 10 is connected to the ground terminal (not shown) that applies the ground potential. That part of the guard ring 7 is connected to the power-supply line 10 by a contact plug 11.

In the semiconductor device SD2 thus structured, the guard ring 7 is fixed at the ground potential. The guard ring 7 is waving as in the first embodiment. Hence, its resistance Rg is higher than otherwise.

As mentioned above, the second embodiment has no potential-applying lines for applying a potential to the guard ring 7. If a potential-applying line 8 having low resistance were provided around the inductor 1, the guard ring 7 should be connected to the line 8 by contact plugs 9 and should inevitably have a lower resistance. In the second embodiment, only the guard ring 7 formed of a diffusion layer and therefore has high resistance surrounds the inductor 1. Therefore, the guard ring 7 can have higher resistance than its counterpart of the first embodiment that has the potential-applying line 8.

As specified above, the guard ring 7 is waving. Thus, like its counterpart of the first embodiment, the ring 7 can inhibits the decrease in the inductance L and quality factor (Q) of the inductor 1.

It should be noted that the guard ring 7 need not be a closed ring as shown in FIG. 3. Rather, one part of the ring 7 may be cut and removed, thus forming an open ring.

Third Embodiment

A semiconductor device SD3 according to the third embodiment of the invention is characterized in that a part of the guard ring 12 has been cut and removed and a part of the potential-applying line 13, which contacts said part of the ring 12, has been cut and removed. The guard ring 12 is therefore an open ring.

Figure 5:
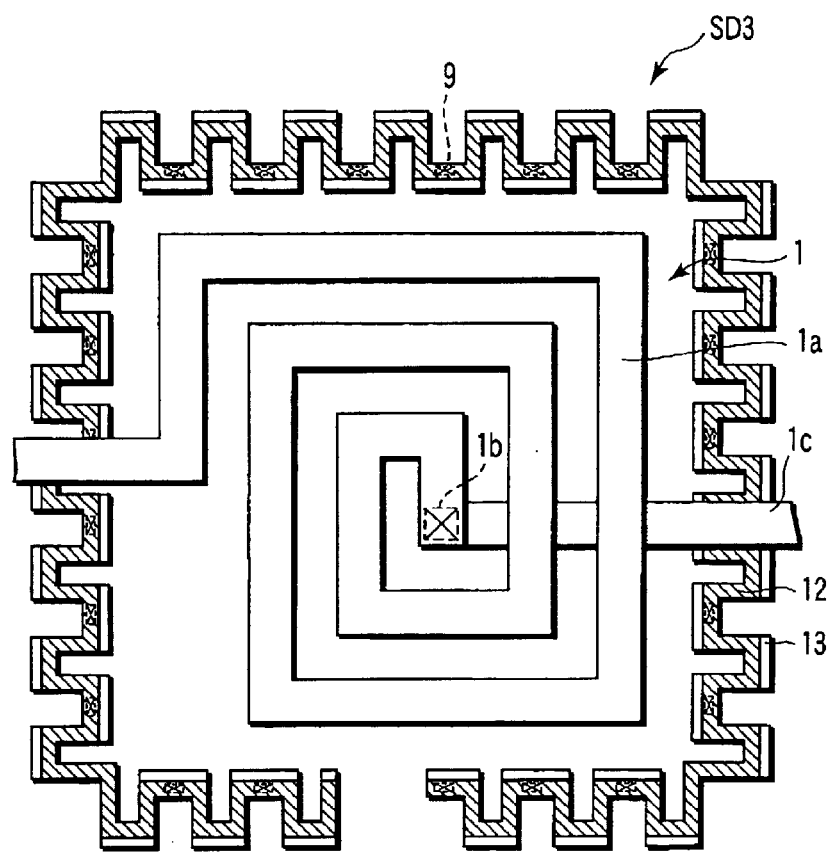
FIG. 5 is a plan view illustrating the major components of a semiconductor device SD3 according to a third embodiment of this invention.

FIG. 5 is a plan view illustrating the major components of the semiconductor device SD3. The components similar or identical to those of the above-described embodiments are designated at the same reference numerals and will not be described in detail.

The guard ring 12 is formed in the surface of the semiconductor substrate 2, surrounding the first metal part 1a of the inductor 1, which is shaped like a spiral. As FIG. 5 depicts, the guard ring 12 is waving. In other words, the ring 12 is composed of not only segments that extend parallel to the tangential direction of the inductor 1, but also segments that extend perpendicular to the tangential direction. The guard ring 12 has been made by cutting and removing a part of a closed ring. It is therefore an open ring, not a closed ring like its counterparts of the first and second embodiments.

A potential-applying line 13 is provided above the guard ring 12. The line 13 is waving in the same way as the guard ring 12. The line is an open ring. It has been made by cutting and removing that part of a closed ring which is aligned with the gap the guard ring 12 has.

The guard ring 12 is connected to the potential-applying line 13 by contact plugs 9 in the same way as in the first embodiment. The potential-applying line 13 is fixed at, or example, the ground potential.

In the semiconductor device SD3 thus configured, the guard ring 12, which is an open ring, has a higher resistance than in the case it is a closed ring. Similarly, the potential-applying line 13, which is an open ring, too, has a higher resistance than in the case it is a closed ring. This inhibits the inductance L and quality factor (Q) of the inductor 1 from decreasing.

Fourth Embodiment

A semiconductor device SD4 according to the fourth embodiment of this invention is characterized in that the guard ring 7 is a closed ring, whereas the potential-applying line 13 is an open ring.

Figure 6:
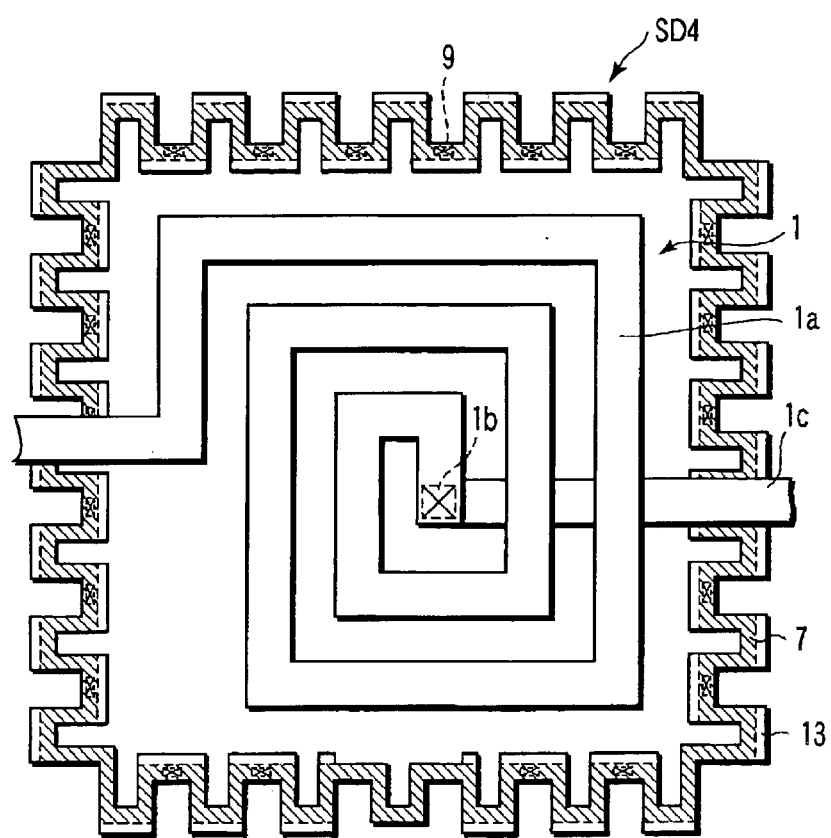
FIG. 6 is a plan view showing the major components of a semiconductor device SD4 according to a fourth embodiment of the invention.

FIG. 6 is a plan view showing the major components of the semiconductor device SD4. The components similar or identical to those of the above-described embodiments are designated at the same reference numerals and will not be described in detail.

The guard ring 7 is formed in the surface of the semiconductor substrate 2, surrounding the first metal part 1a of the inductor 1, which is shaped like a spiral. As FIG. 6 illustrates, the guard ring 7 is waving.

The potential-applying line 13 is provided above the guard ring 7. The potential-applying line 13 is waving in the same way as the guard ring 7. It has been made by cutting and removing a part of a closed waving ring. That is, the line 13 is an open ring.

The guard ring 7 has higher resistance than in the case a potential-applying line that is a closed ring is provided above it. This inhibits the inductance L and quality factor (Q) of the inductor 1 from decreasing.

A potential can be applied to the guard ring 7 more uniformly than in the case where no potential-applying lines are provided as in the second embodiment.

(Fifth Embodiment)

Figure 7:
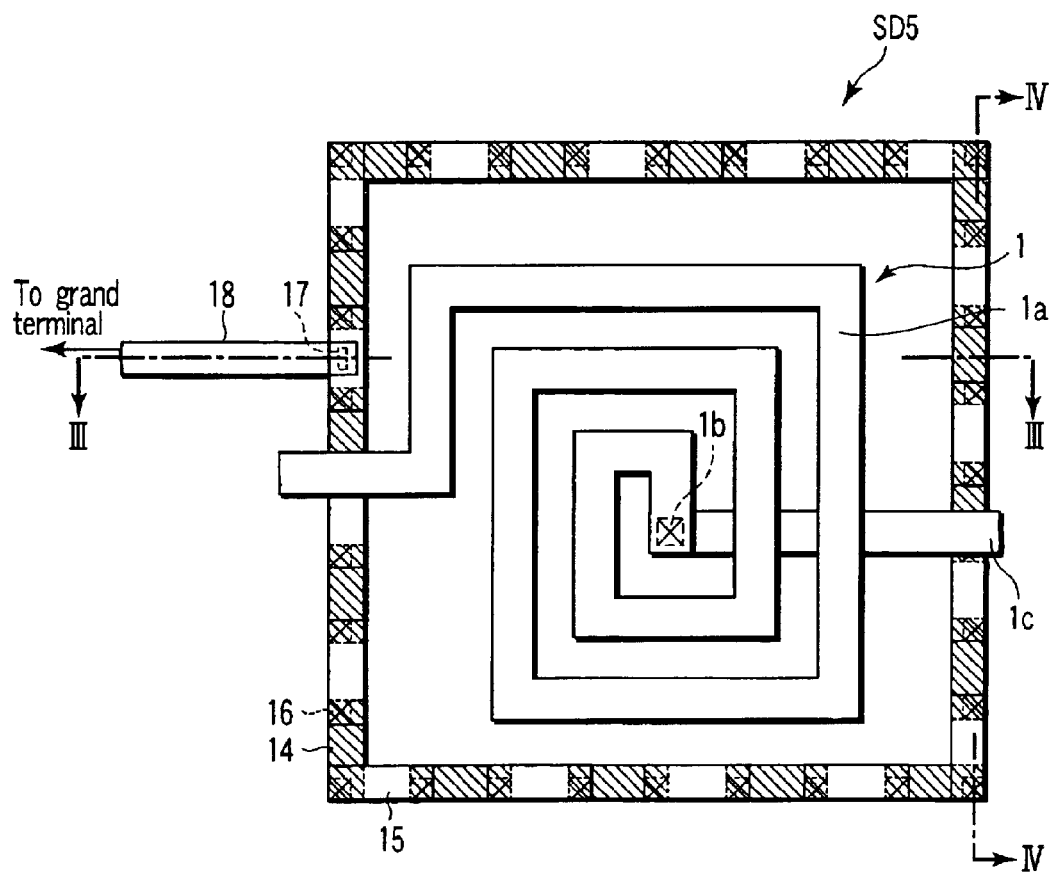
FIG. 7 is a plan view illustrating the major components of a semiconductor device SD5 according to a fifth embodiment of the invention.
Figure 8:
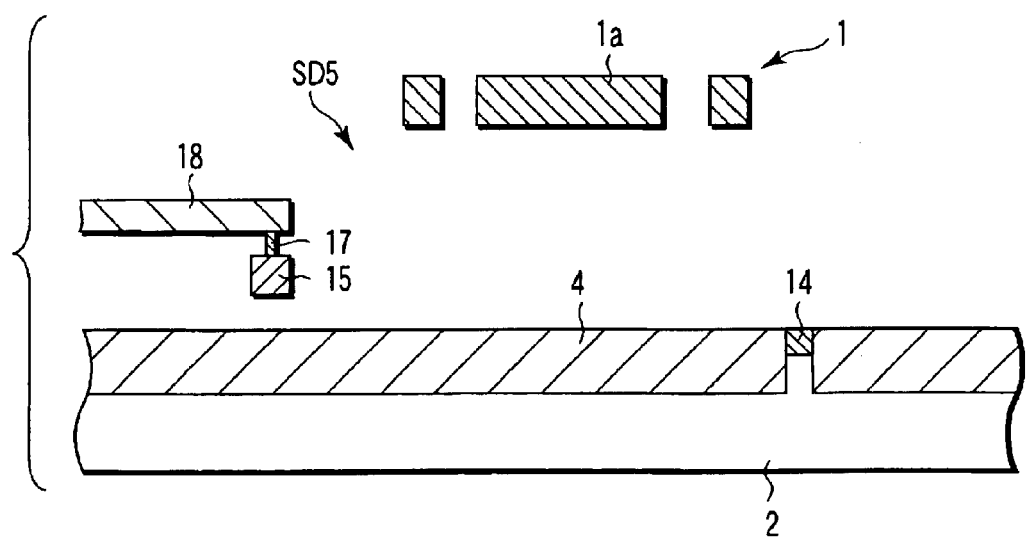
FIG. 8 is a sectional view of the semiconductor device SD5, taken along line III—III shown in FIG. 7.
Figure 9:
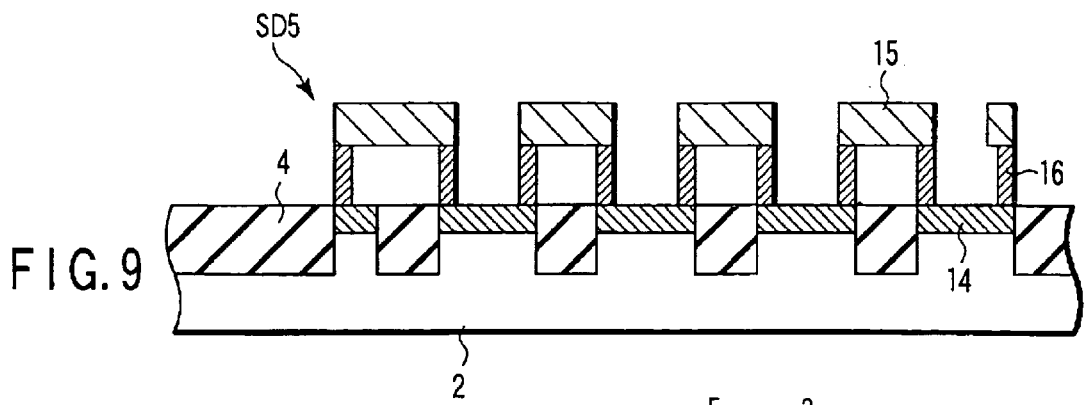
FIG. 9 is a sectional view of the semiconductor device SD5, taken along line IV—IV shown in FIG. 7.

FIG. 7 is a plan view illustrating the major components of a semiconductor device SD5 according to a fifth embodiment of the invention. FIG. 8 is a sectional view of the device SD5, taken along line III—III shown in FIG. 7. FIG. 9 is a sectional view of the device SD5, taken along line IV—IV shown in FIG. 7. The components similar or identical to those of the above-described embodiments are designated at the same reference numerals and will not be described in detail.

As seen from FIG. 8, an inductor 1 is provided above a semiconductor substrate 2. The inductor 1 has a metal part 1a that is shaped like a spiral. A guard ring 14 is formed in the surface of the substrate 2, surrounding the metal part 1a of the inductor 1. As FIG. 9 depicts, the guard ring 14 is composed of segments that are spaced apart.

The guard ring 14 is a $p^+$ diffusion layer that has been formed by injecting p-type impurities into the p-type semiconductor substrate 2. The guard ring 14 is surrounded by an insulator (not shown) such as an oxide film. The guard ring 14 may be made of self-aligned silicide.

A potential-applying line 15 is provided above the guard ring 14. As FIG. 9 shows, the line 15 is composed of segments that lie above the spaces between the segments of the guard ring 14. The potential-applying line 15 is made of, for example, metal having low specific resistance.

The guard ring 14 and the potential-applying line 15 are connected by a plurality of contact plugs 16. As shown in FIG. 9, the contact plugs 16 are so arranged that the segments of the guard ring 14 and those of the potential-applying line 15 may be connected in series. Thus, the guard ring 14, line 15 and contact plugs 16 constitute a closed ring.

A power-supply line 18 is provided above a part of the potential-applying line 15. The power-supply line 18 is connected to the ground terminal (not shown) that applies the ground potential. That part of the line 15 is connected to the power-supply line 18 by a contact plug 17. The guard ring 14 is thereby fixed at the ground potential.

In the semiconductor device SD 5 thus configured, the segments of the guard ring 14 and those of the potential-applying line 15 are connected in series, thus constituting a closed ring. If the segments of the guard ring 14 were connected together and that the segments of the line 15 were connected together, the guard ring 14 and the power-applying line 15 would be connected in parallel. This would inevitably lower the resistance of the guard ring 14. In the fifth embodiment, the closed ring constituted by the segments of the guard ring 14 and line 15 has a higher resistance than a ring composed of guard ring segments or a ring composed of potential-applying-line segments.

As has been detailed, the fifth embodiment is characterized in that the guard ring 14 composed of segments spaced apart surrounds the inductor 1 and the segments of the potential-applying line 15 lies above the spaces between the segments of the guard ring 14. The contact plugs 16 connect the segments of the guard ring 14 to those of the line 15 in series.

Hence, the closed ring constituted by the segments of the guard ring 14 and line 15 has a higher resistance than a ring composed of guard ring segments or a ring composed of potential-applying-line segments. As a result, the inductance L and quality factor (Q) of the inductor 1 can be inhibited from decreasing.

Note that the contact plugs 16 have high resistance. Further, the resistance of the contact between each contact plug 16 and one segment of the guard ring 14 is high. So is the resistance of the contact between each contact plug 16 and one segment of the potential-applying line 15.

Additional advantages and modifications will readily occur to those skilled in the art. Therefore, the invention in its broader aspects is not limited to the specific details and representative embodiments shown and described herein. Accordingly, various modifications may be made without departing from the sprint or scope of the general inventive concept as defined by the appended claims and their equivalents.

What is claimed is:

1. A semiconductor device comprising:
   a semiconductor substrate;
   an insulating layer formed on the semiconductor substrate;
   an inductor formed on the insulating layer;
   a guard ring formed in the semiconductor substrate, surrounding the inductor and being a closed ring composed of waving segments connected, end to end; and
   a potential-applying line which applies a predetermined potential to the guard ring.

2. The semiconductor device according to claim 1, wherein the potential-applying line comprises a first contact plug which connects one part of the guard ring to a power-supply line.

3. The semiconductor device according to claim 1, wherein the potential-applying line comprises a first line which is provided above the guard ring and which is composed of waving segments connected, end to end, and a plurality of second contact plugs which connect the first line to the guard ring.

4. The semiconductor device according to claim 3, wherein the potential-applying line is an open ring made by cutting and removing a part of a closed ring.

5. The semiconductor device according to claim 3, wherein the guard ring is an open ring made by cutting and removing a part of a first closed ring, and the potential-applying line is an open ring made by cutting and removing that part of a second closed ring which is aligned with said part of the first closed ring.

6. The semiconductor device according to claim 1, wherein the guard ring comprises first segments and second segments which are alternately arranged and connected to one another, the second segments extending at right angles to the first segments.

7. A semiconductor device comprising:
   a semiconductor substrate;
   an insulating layer formed on the semiconductor substrate;
   an inductor formed on the insulating layer;
   a guard ring formed in the semiconductor substrate, surrounding the inductor and being composed of a plurality of segments spaced apart from one another; and
   a potential-applying line which applies a predetermined potential to the guard ring and which comprises a plurality of segments located above spaces between the segments of the guard ring, respectively.

8. The semiconductor device according to claim 7, further comprising a plurality of contact plugs which connect the guard ring and the potential-applying line in series.

9. The semiconductor device according to claim 7, further comprising a second contact plug which connects a part of the potential-applying line to a power-supply terminal which applies the predetermined potential.

10. The semiconductor device according to claim 1, wherein the inductor is shaped like a spiral.

11. The semiconductor device according to claim 7, wherein the inductor is shaped like a spiral.

12. The semiconductor device according to claim 1, wherein the semiconductor substrate is of a first conductivity type, and the guard ring has been formed by adding impurities of the first conductivity type to the semiconductor substrate.

13. The semiconductor device according to claim 7, wherein the semiconductor substrate is of a first conductivity type, and the guard ring has been formed by adding impurities of the first conductivity type to the semiconductor substrate.

* * * * *